United States Patent [19]

King

[11] 4,090,055
[45] May 16, 1978

[54] APPARATUS FOR MANUFACTURING AN OPTICAL FIBRE WITH PLASMA ACTIVATED DEPOSITION IN A TUBE

[75] Inventor: Frederick David King, Smith Falls, Canada

[73] Assignee: Northern Telecom Limited, Montreal, Canada

[21] Appl. No.: 768,068

[22] Filed: Feb. 14, 1977

[51] Int. Cl.² .................. H05B 9/06; C03C 25/02; C03B 25/00; C03B 5/02
[52] U.S. Cl. ....................... 219/10.55 R; 65/3 A; 65/12; 65/DIG. 4; 65/134; 219/10.55 A; 13/6; 34/1
[58] Field of Search ............. 65/3 A, DIG. 4, 12, 65/134; 13/6; 219/10.55 R, 10.55 A; 34/1

[56] References Cited

U.S. PATENT DOCUMENTS

| | | | |
|---|---|---|---|
| Re. 28,028 | 6/1974 | Maurer | 65/3 A |
| 3,258,314 | 6/1966 | Dedmond et al. | 65/DIG. 4 |
| 3,484,276 | 12/1969 | Durggraaf et al. | 65/DIG. 4 |
| 3,590,202 | 6/1971 | Day | 219/10.55 A |
| 3,670,132 | 6/1972 | Kaufman, Jr. et al. | 219/10.55 A |
| 3,711,262 | 1/1973 | Keck et al. | 65/3 A |
| 3,944,640 | 3/1976 | Haggerty et al. | 65/DIG. 4 |
| 3,961,926 | 6/1976 | Asam | 65/3 A |
| 3,980,459 | 9/1976 | Li | 65/3 A X |
| 3,982,916 | 9/1976 | Miller | 65/3 A |

Primary Examiner—Richard V. Fisher
Assistant Examiner—Frank W. Miga
Attorney, Agent, or Firm—Sidney T. Jelly

[57] ABSTRACT

An optical fibre is manufactured by forming a layer of fused silica, which may or may not be doped, on the inner wall of a fused silica tube by producing a plasma in the reactant gases flowing through the tube. By this means a higher temperature can be maintained inside the tube than at the tubes outer wall. The plasma is produced at substantially atmospheric pressure. Cooling gas is passed along the outer wall of the tube.

4 Claims, 1 Drawing Figure

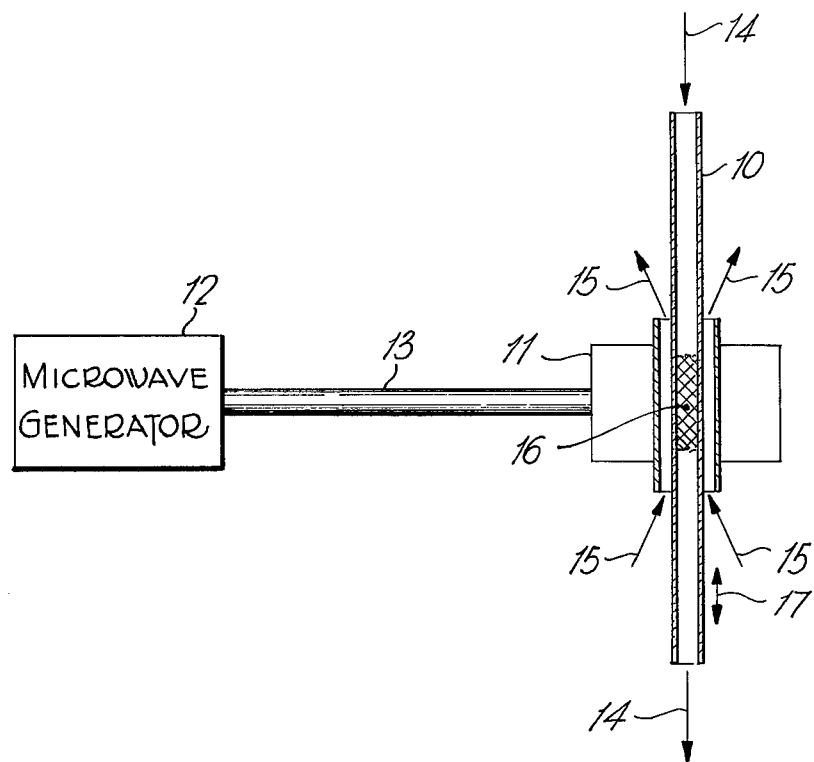

APPARATUS FOR MANUFACTURING AN OPTICAL FIBRE WITH PLASMA ACTIVATED DEPOSITION IN A TUBE

This invention relates to a method of manufacturing an optical fibre by plasma activated deposition in a tube, and to apparatus for such a method. In particular the invention is concerned with the deposition of doped and undoped silica on the inner wall of a fused silica tube, using a plasma inside the tube.

In conventional deposition of silica in a tube, as for example by chemical vapour deposition, (CVD), heat is applied to the outside of the tube and conducted through the wall to the reactant gases. This imposes limitations on the maximum wall thickness and tube inside diameter. Also, and generally more importantly, the maximum temperature and deposition zone length are limited by the distortion and surface tension induced shrinkage of the substrate tube.

Furthermore, in the CVD process, the majority of the final deposit results from the fusion of the soot formed in the hot zone and deposited downstream on the walls of the tube. The maximum soot layer which may be fused depends upon the temperature, the traverse speed of the heating zone and the hot zone length.

In the present invention a high electric field produces a plasma in the reactant gases in the fused silica or quartz tube. By this means, a higher temperature can be maintained inside the tube than at the tube outside wall. The plasma can be produced at substantially atmospheric pressure.

The invention will be readily understood by the following description of an embodiment of the invention, and modifications thereof, in conjunction with the accompanying drawing which is a diagrammatic illustration of one form of apparatus for carrying out the invention.

As illustrated in the drawing, a substrate tube 10, of fused silica, is placed through a microwave cavity 11. The cavity 11 is connected to a high power (several KW) high frequency (2.45GH$_z$) microwave generator 12 by a waveguide 13. Gas is fed through the tube 10, as indicated by the arrows 14 and cooling gas is passed along the outside of the tube, in the microwave cavity, as indicated by the arrows 15.

A typical process is as follows. After cleaning the tube 10, the tube is placed through the microwave cavity 11 and flushed with a suitable carrier gas, for example argon. The microwave field is applied and the plasma initiated, the plasma indicated at 16 in FIG. 1. Initiation of the plasma may be aided by partially ionizing the input gas using electrical, optical or thermal exitation.

A large change in cavity impedance, and a consequent mismatch between the generator and the load, occurs when the plasma starts. This can be allowed for by starting the plasma at a reduced pressure and then increasing the pressure in the tube to about atmosphere, with simultaneous re-tuning of the cavity.

Upon striking the stable atmospheric plasma, considerable heat will be generated within the tube 10. A cooling gas, for example nitrogen, is passed between the metal cavity and the outside wall of the tube. The temperature of the outside wall of the tube is maintained at less than 1000° C, the inside wall being in the range of about 1000°–1700° C. The tube is traversed several times through the cavity 11 to allow scratches and imperfections in the inside wall to be fused away.

To deposit, reactant gases, such as O$_2$ and SiCl$_4$, are mixed with the carrier gas. Doping gases, for example POCl$_3$, GECl$_4$, SiF$_4$, BCl$_3$ and other gases, are added to the gas mixture if doped layers are required. The gases become ionized and react on the wall of the tube 10 to give a glassy silica deposit. The reaction takes place on the inner wall of the tube and provided the inner wall temperature is at least at 1000° C a glass layer is formed directly. No significant "soot" deposits are formed. The tube is traversed back and forth through the cavity 11 whilst deposition is carried out, as indicated by the arrows 17. The O$_2$ is supplied direct from an oxygen source while the other gases can be provided by bubbling oxygen through suitable solutions, in a known manner.

The deposition is continued, with traversing of the tube 10, until a sufficiently thick layer has been deposited. Preforms having any required refractive index profile may be fabricated by suitably altering the ratio and/or type of dopant gas added. Successive layers of high and low refractive index can be deposited.

After completion of deposition, the tube is collapsed to a solid rod by heating with or without some drawing. The rod is then drawn into a fibre in a conventional manner.

The invention has several advantages over other processes as are at present in use. In most conventional processes, for example CVD and flame hydrolysis, heat is applied from the exterior of the tube and as the fusion temperature of the "soot" which is normally the first stage of deposition is fairly close to the softening temperature of the silica tube, great care is necessary to obtain a satisfactory fusion temperature inside the tube without softening the tube or other undesirable effects. The deposition surface temperature in the plasma can be lower, for example of the order of 1000° C, than the 1400° C plus required for soot fusion in the conventional CVD process. This can allow an increase in the incorporation ratio for volatile dopants. This is of particular interest for fluorine where the low incorporation ratio at the conventional higher temperature required to fuse fluorine doped silica soot limits the fibre numerical aperture (NA) which can be obtained.

Operating at about atmospheric pressure provides for sufficiently high temperatures inside the tube, giving good deposition rates and also means that no external heating is required. As stated, the reactant gases can be heated, or some other form of pre ionization used. Typical examples are a Tesla coil field or the use of an ionization radiation source such as Cesium.

As the pressure in the system is lowered below atmosphere, so the temperature created by the plasma is lowered until insufficient heat is generated for deposition of a glassy layer. In addition the deposition rate decreases and some form of pumping system and pressure control is needed for the entire process. Increasing the pressure above atmosphere results in it being more difficult to strike the plasma.

What is claimed is:
1. Apparatus for manufacturing an optical fibre having fused silica layers, comprising:
   a microwave cavity and means for applying a microwave field to said cavity;
   support means for supporting a fused silica tube in said cavity and means for traversing said tube axially in said cavity;

means for supplying a mixture of gases to a fused silica tube supported in said support means for passage of said mixture of gases through said tube, said mixture of gases comprising a carrier gas, oxygen and a reactant gas comprising a gaseous form of the material to form said fused layers; and means for supplying a cooling medium for passage along the outside of a fused silica tube supported in said support means;

the arrangement such that said microwave field can produce ionization of at least one of said oxygen and said reactant gas to form a plasma in said tube and produce a temperature of at least 1000° C on the inside wall of the tube whereby a fused layer of said material is formed on said inner wall.

2. Apparatus as claimed in claim 1, including means for supplying a doping material in gaseous form to said mixture of gases, said doping material one to vary the refractive index of said fused layer from the refractive index of fused silica.

3. Apparatus as claimed in claim 2, wherein the means for supplying a doping material to said mixture of gases includes means for controllably varying the supply of doping material to whereby the refractive index of said fused material can be varied radially.

4. Apparatus as claimed in claim 2, including means for applying heat internally to said tube to collapse said tube to a solid rod.

* * * * *

UNITED STATES PATENT AND TRADEMARK OFFICE
CERTIFICATE OF CORRECTION

PATENT NO. : 4,090,055
DATED : May 16, 1978
INVENTOR(S) : Frederick David King

It is certified that error appears in the above—identified patent and that said Letters Patent is hereby corrected as shown below:

Columns 1 thru 4 of the above-identified patent should be deleted to insert the attached columns 1 thru 4 respectively therefor.

THIS CERTIFICATE APPLYS TO THE GRANT EXCLUSIVELY.

Signed and Sealed this

Twelfth Day of February 1980

[SEAL]

Attest:

SIDNEY A. DIAMOND

Attesting Officer    Commissioner of Patents and Trademarks